(12) United States Patent
Lin et al.

(10) Patent No.: US 8,791,008 B2
(45) Date of Patent: Jul. 29, 2014

(54) SEMICONDUCTOR DEVICE AND METHOD OF FORMING MICRO-VIAS PARTIALLY THROUGH INSULATING MATERIAL OVER BUMP INTERCONNECT CONDUCTIVE LAYER FOR STRESS RELIEF

(75) Inventors: Yaojian Lin, Singapore (SG); Kang Chen, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 76 days.

(21) Appl. No.: 13/426,552

(22) Filed: Mar. 21, 2012

(65) Prior Publication Data

US 2013/0249105 A1  Sep. 26, 2013

(51) Int. Cl.
*H01L 21/44* (2006.01)

(52) U.S. Cl.
USPC ........... 438/613; 438/612; 438/614; 438/615; 438/616; 257/774

(58) Field of Classification Search
None
See application file for complete search history.

(56) References Cited

U.S. PATENT DOCUMENTS

| | | | |
|---|---|---|---|
| 2008/0023851 A1* | 1/2008 | Andry et al. | 257/779 |
| 2009/0160052 A1 | 6/2009 | Yang et al. | |
| 2011/0024900 A1* | 2/2011 | Walter et al. | 257/737 |

* cited by examiner

*Primary Examiner* — Steven Loke
*Assistant Examiner* — Juanita B Rhodes
(74) *Attorney, Agent, or Firm* — Robert D. Atkins; Patent Law Group: Atkins & Associates, P.C.

(57) ABSTRACT

A semiconductor device has a semiconductor die and first insulating layer formed over the semiconductor die. A plurality of first micro-vias can be formed in the first insulating layer. A conductive layer is formed in the first micro-openings and over the first insulating layer. A second insulating layer is formed over the first insulating layer and conductive layer. A portion of the second insulating layer is removed to expose the conductive layer and form a plurality of second micro-openings in the second insulating layer over the conductive layer. The second micro-openings can be micro-vias, micro-via ring, or micro-via slots. Removing the portion of the second insulating layer leaves an island of the second insulating layer over the conductive layer. A bump is formed over the conductive layer. A third insulating layer is formed in the second micro-openings over the bump. The second micro-openings provide stress relief.

25 Claims, 19 Drawing Sheets

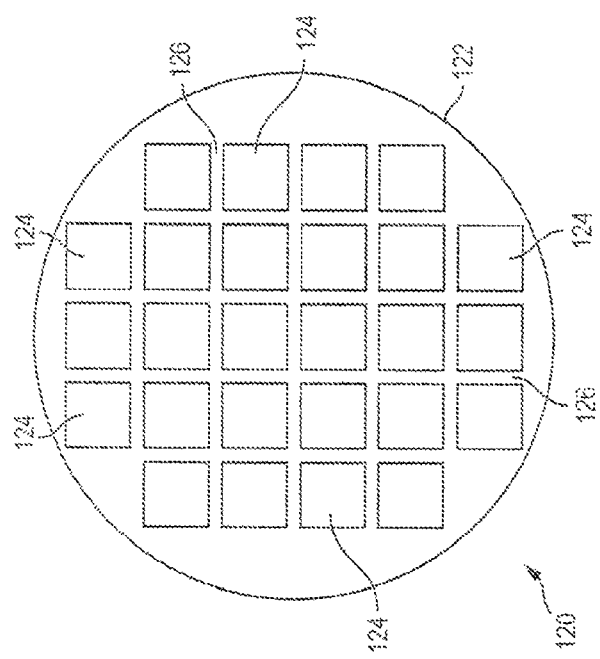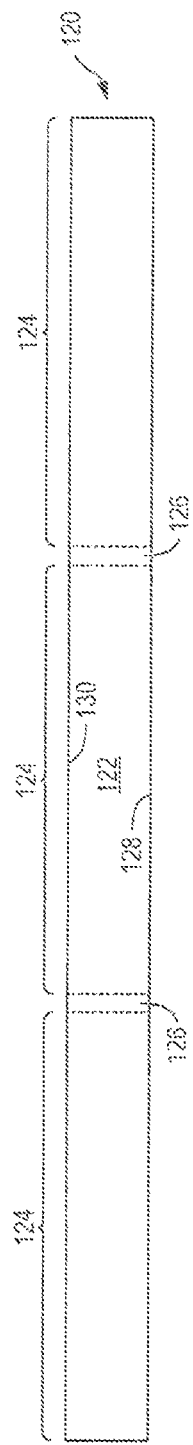

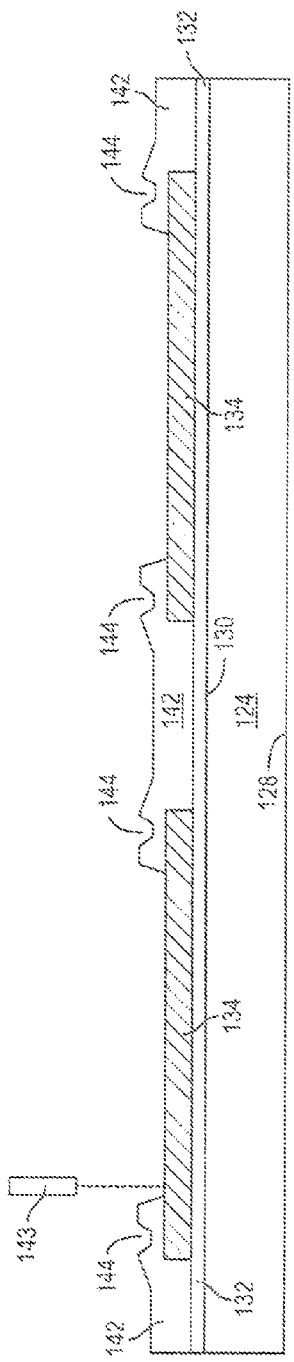
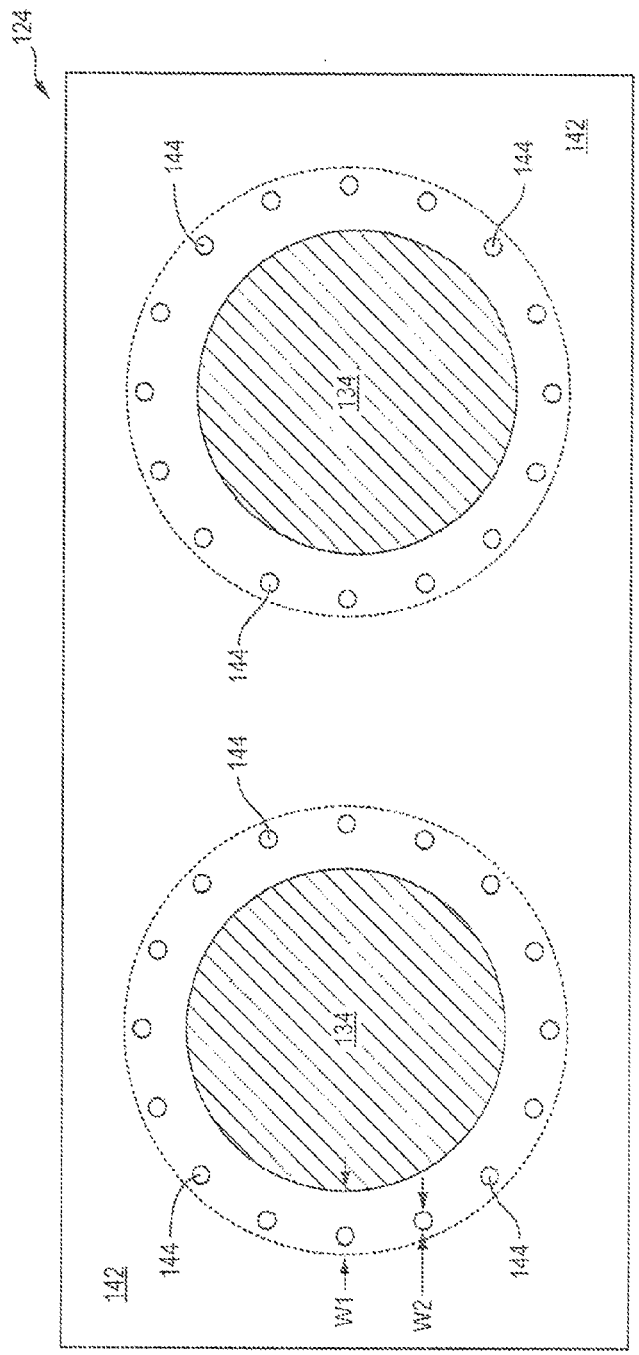

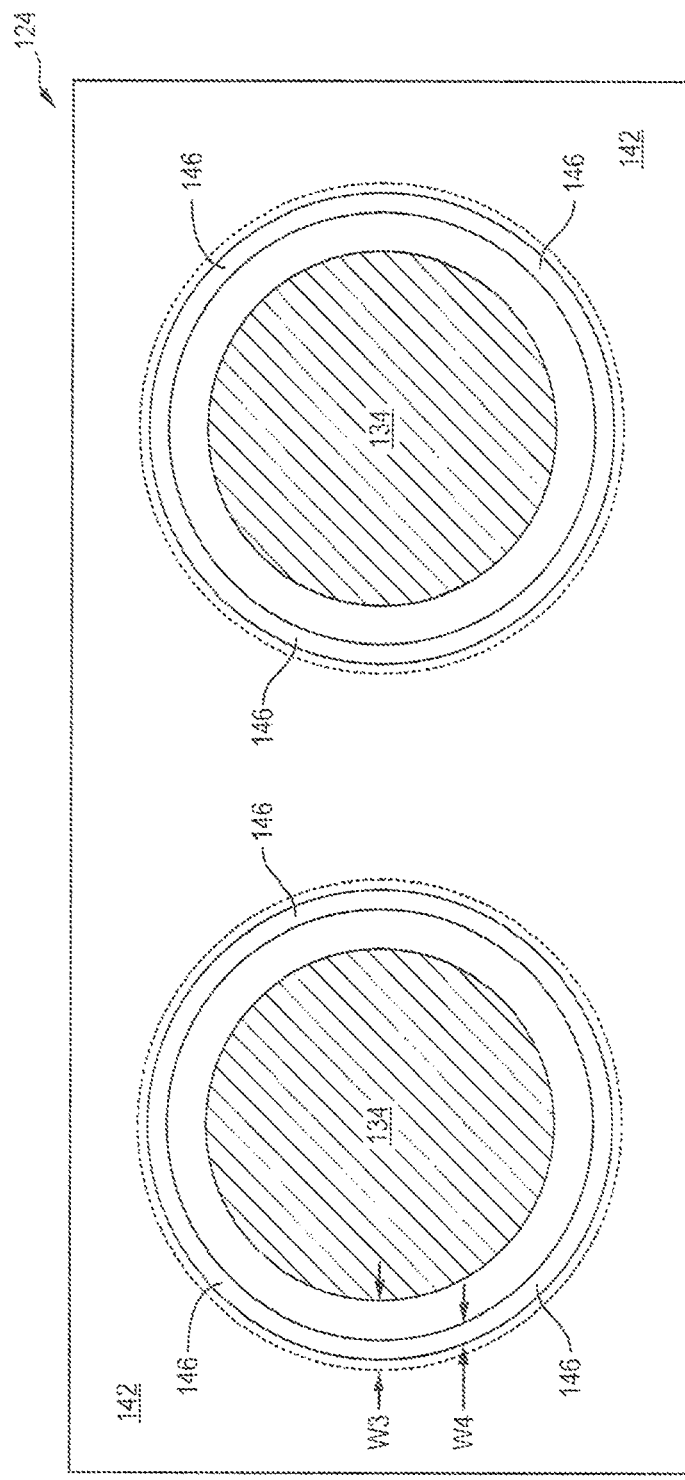

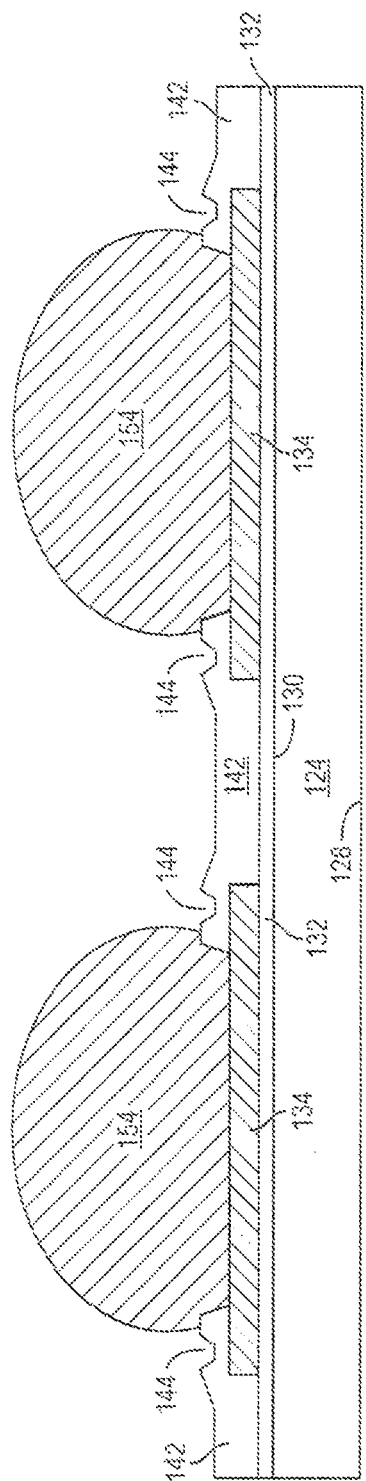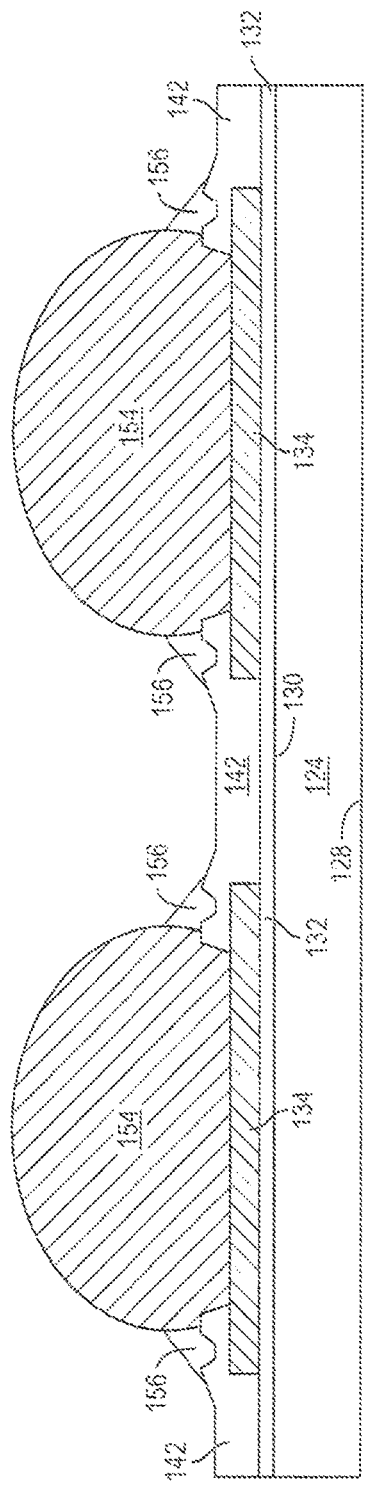

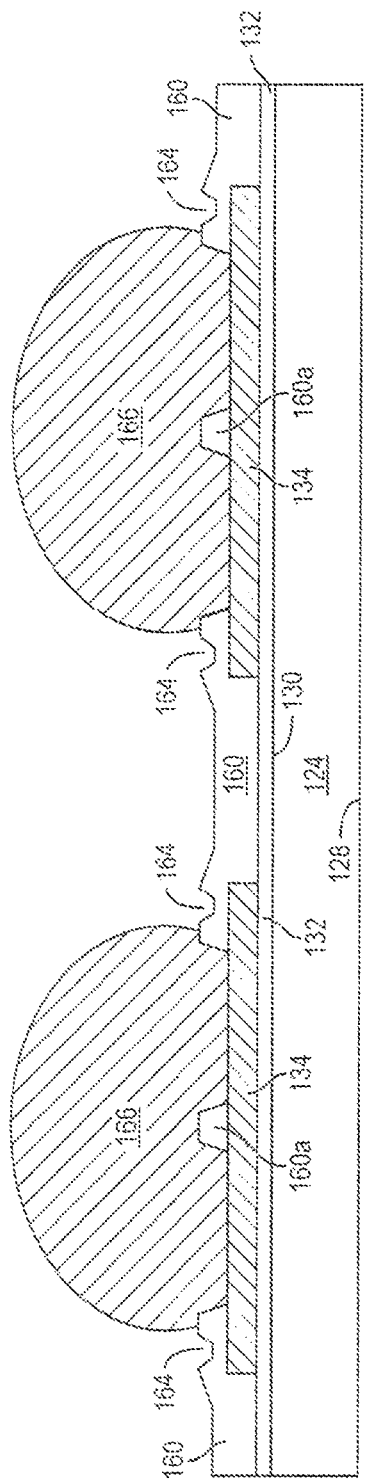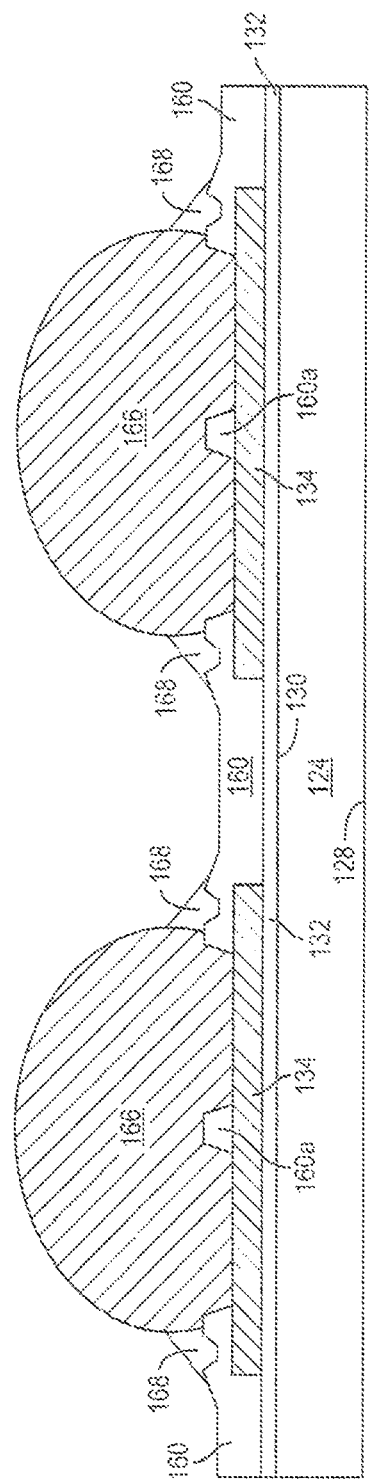
FIG. 5d
FIG. 5e

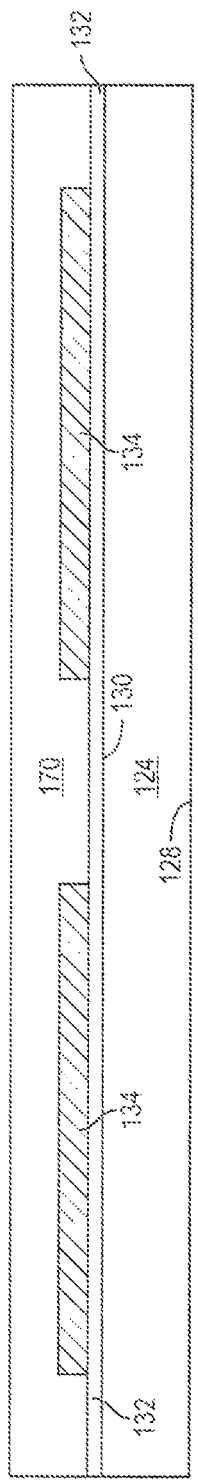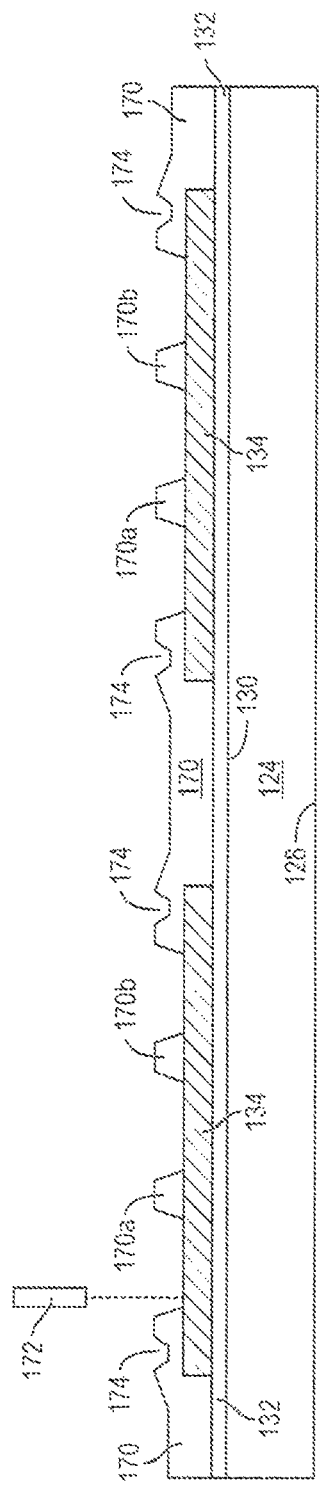

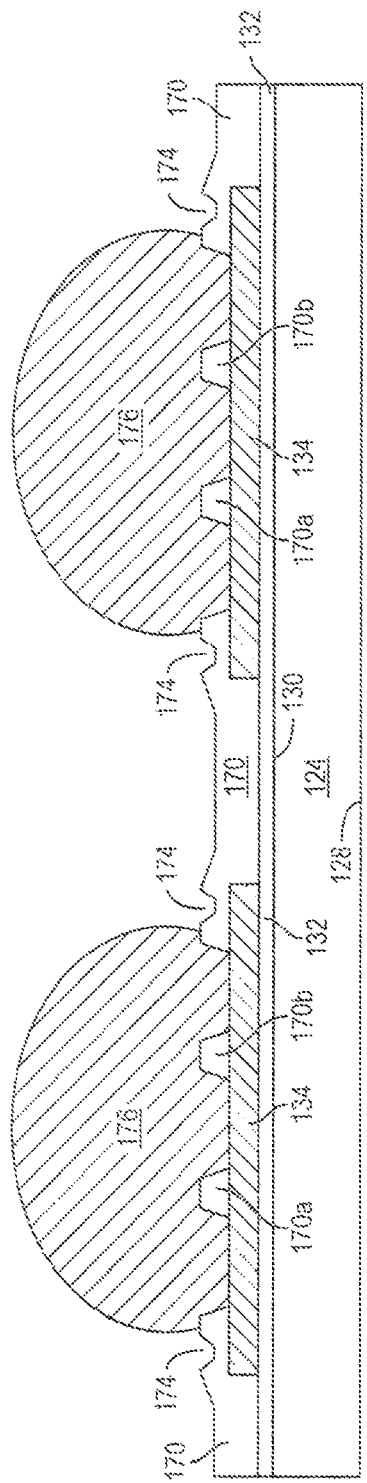
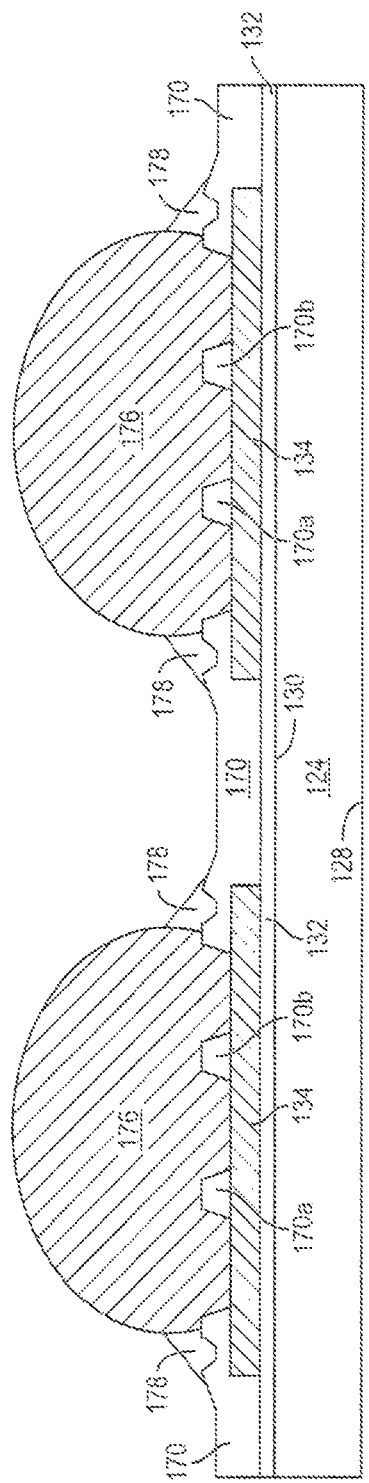
FIG. 6d
FIG. 6e

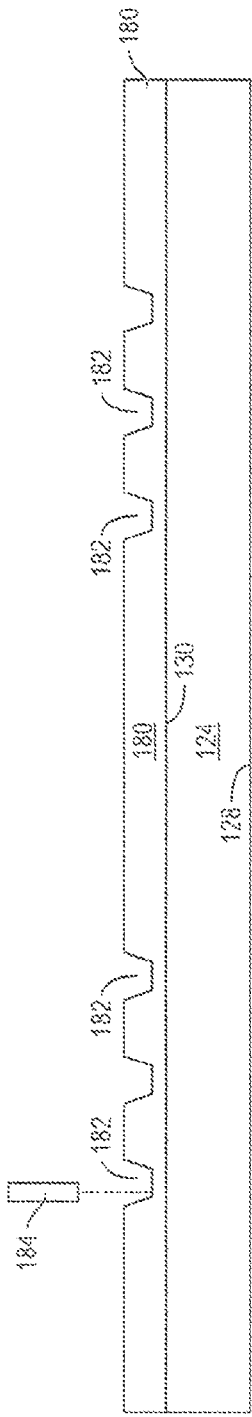
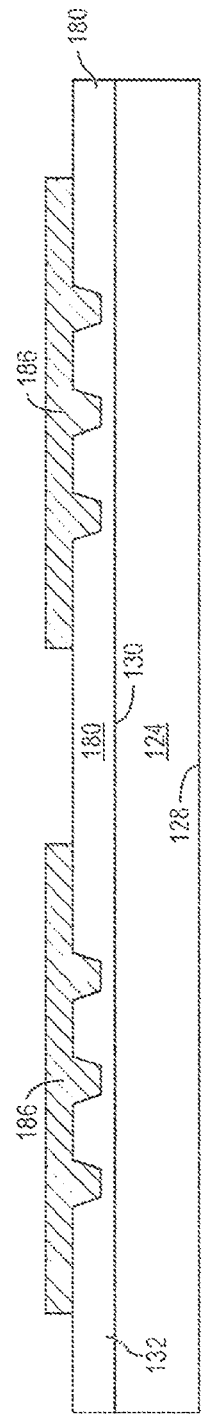
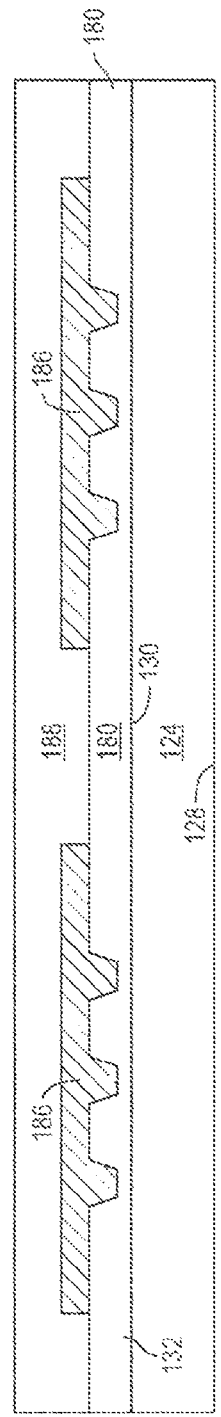
FIG. 7a
FIG. 7b
FIG. 7c

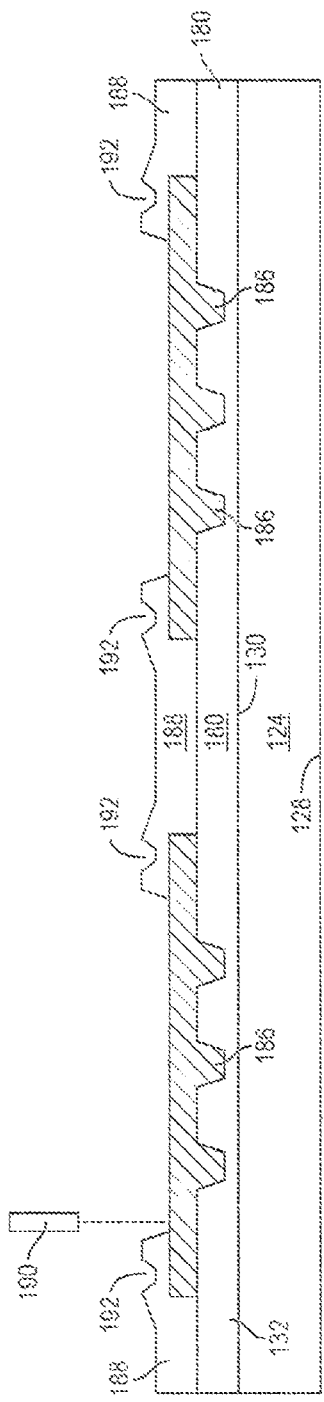
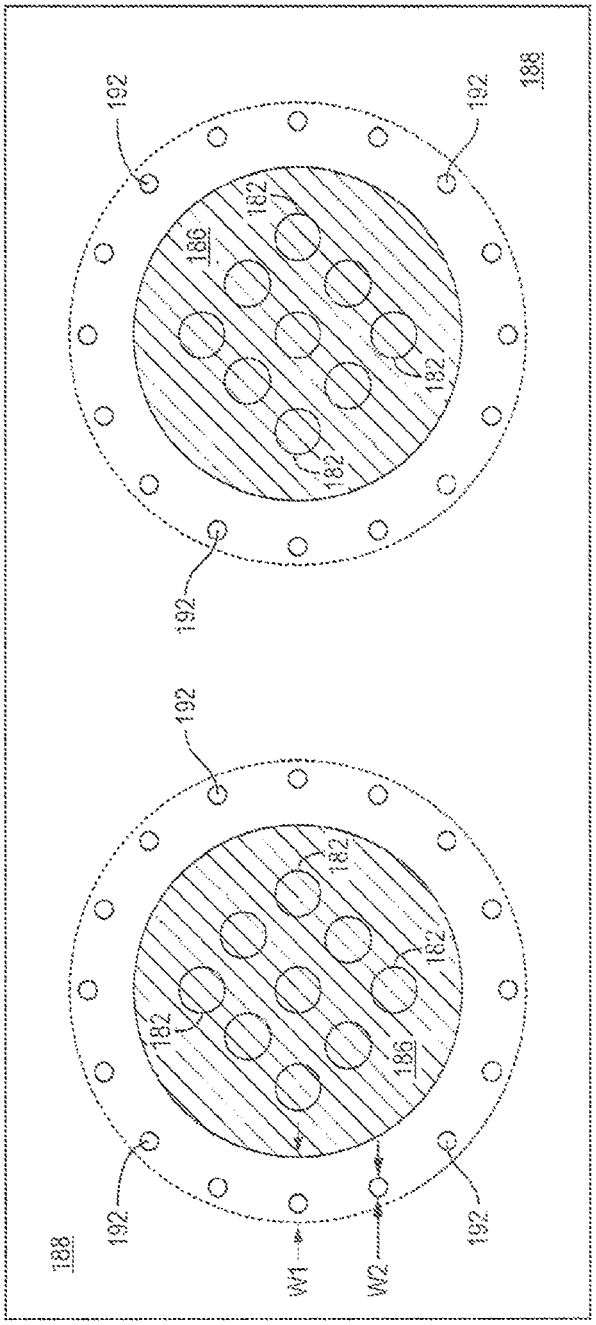
FIG. 7d
FIG. 7e

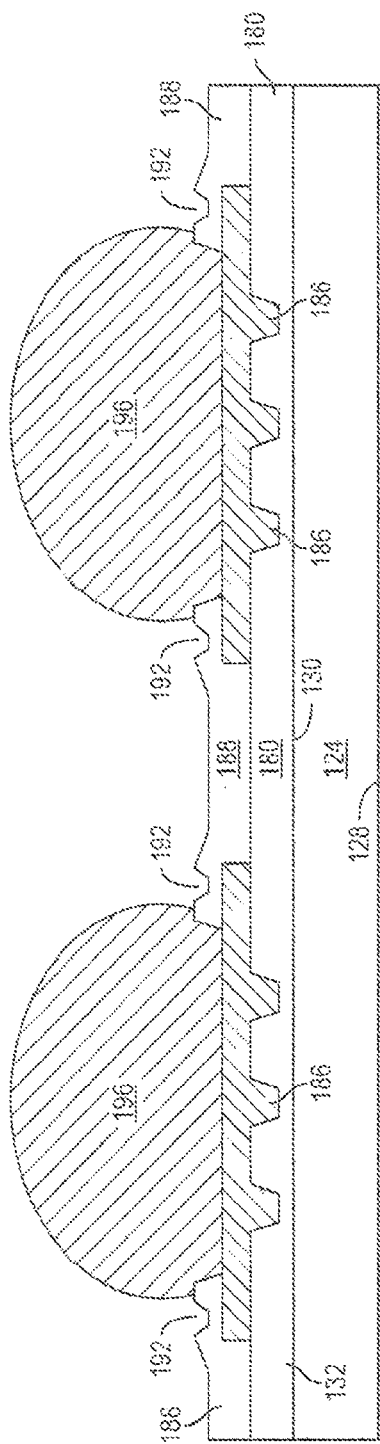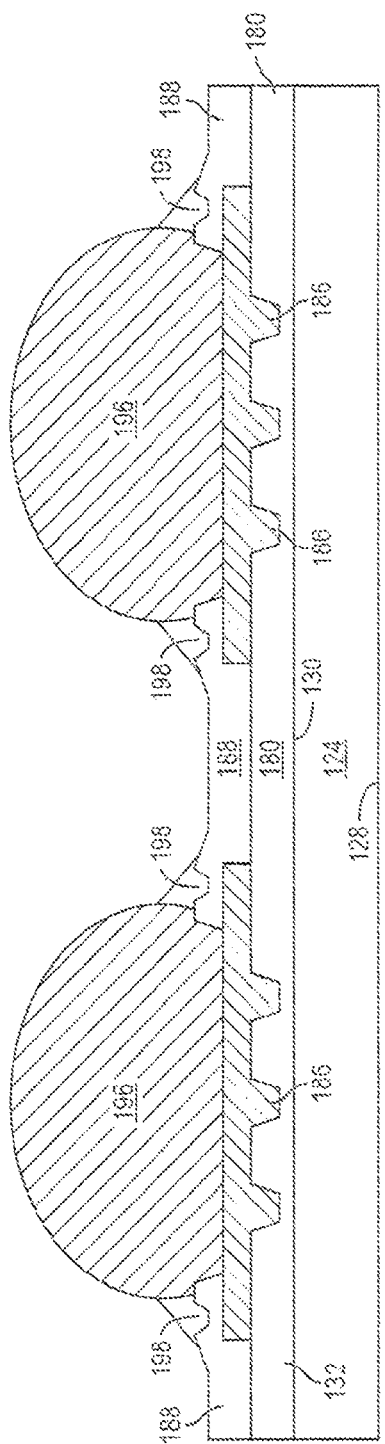

SEMICONDUCTOR DEVICE AND METHOD OF FORMING MICRO-VIAS PARTIALLY THROUGH INSULATING MATERIAL OVER BUMP INTERCONNECT CONDUCTIVE LAYER FOR STRESS RELIEF

FIELD OF THE INVENTION

The present invention relates in general to semiconductor devices and, more particularly, to a semiconductor device and method of forming micro-vias partially through an insulating material over a bump interconnect conductive layer for stress relief.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor wafer typically contains a plurality of contact pads formed over an active surface of the wafer. An insulating layer is formed over the active surface and contact pads. A portion of the insulating layer is removed to expose the contact pads. A plurality of bumps is formed over the exposed contact pads for electrical interconnect. The insulating layer around the contact pads is known to crack, particularly around the edge of the contact pad due to stress imposed by the bumps. The insulating layer cracking leads to defects and other reliability problems.

SUMMARY OF THE INVENTION

A need exists to reduce bump-induced stress on the insulating layer over the contact pad. Accordingly, in one embodiment, the present invention is a method of making a semiconductor device comprising the steps of providing a semiconductor die, forming a first insulating layer over the semiconductor die, forming a conductive layer over the first insulating layer, forming a second insulating layer over the first insulating layer and conductive layer, removing a portion of the second insulating layer to expose the conductive layer and form a plurality of first micro-vias in the second insulating layer over the conductive layer, and forming a bump over the conductive layer. The first micro-vias provide stress relief.

In another embodiment, the present invention is a method of making a semiconductor device comprising the steps of providing a substrate, forming a conductive layer over the substrate, forming a first insulating layer over the substrate and conductive layer, removing a portion of the first insulating layer to expose the conductive layer and form a plurality of first micro-openings in the first insulating layer over the conductive layer, and forming an interconnect structure over the conductive layer.

In another embodiment, the present invention is a method of making a semiconductor device comprising the steps of providing a substrate, forming a conductive layer over the substrate, forming a first insulating layer having a plurality of first micro-openings over the substrate and conductive layer, and forming an interconnect structure over the conductive layer.

In another embodiment, the present invention is a semiconductor device comprising a substrate and conductive layer formed over the substrate. A first insulating layer has a plurality of first micro-openings formed over the substrate and conductive layer. An interconnect structure is formed over the conductive layer.

BRIEF DESCRIPTION OF THE DRAWINGS

FIGS. 3a-3b illustrate a semiconductor wafer with a plurality of semiconductor die separated by a saw street;

FIGS. 4a-4j illustrate a process of forming micro-vias partially through an insulating material over a bump interconnect conductive layer for stress relief;

FIGS. 5a-5e illustrate a process of forming micro-vias partially through an insulating material with an island of insulating material disposed over a central portion of the bump interconnect structure for stress relief;

FIGS. 6a-6e illustrate a process of forming micro-vias partially through an insulating material with a plurality of islands of insulating material disposed over the bump interconnect structure for stress relief;

FIGS. 7a-7g illustrate a process of forming micro-vias partially through a first insulating material with the bump interconnect conductive layer extending into a second insulating layer for stress relief.

DETAILED DESCRIPTION OF THE DRAWINGS

Figure 1:
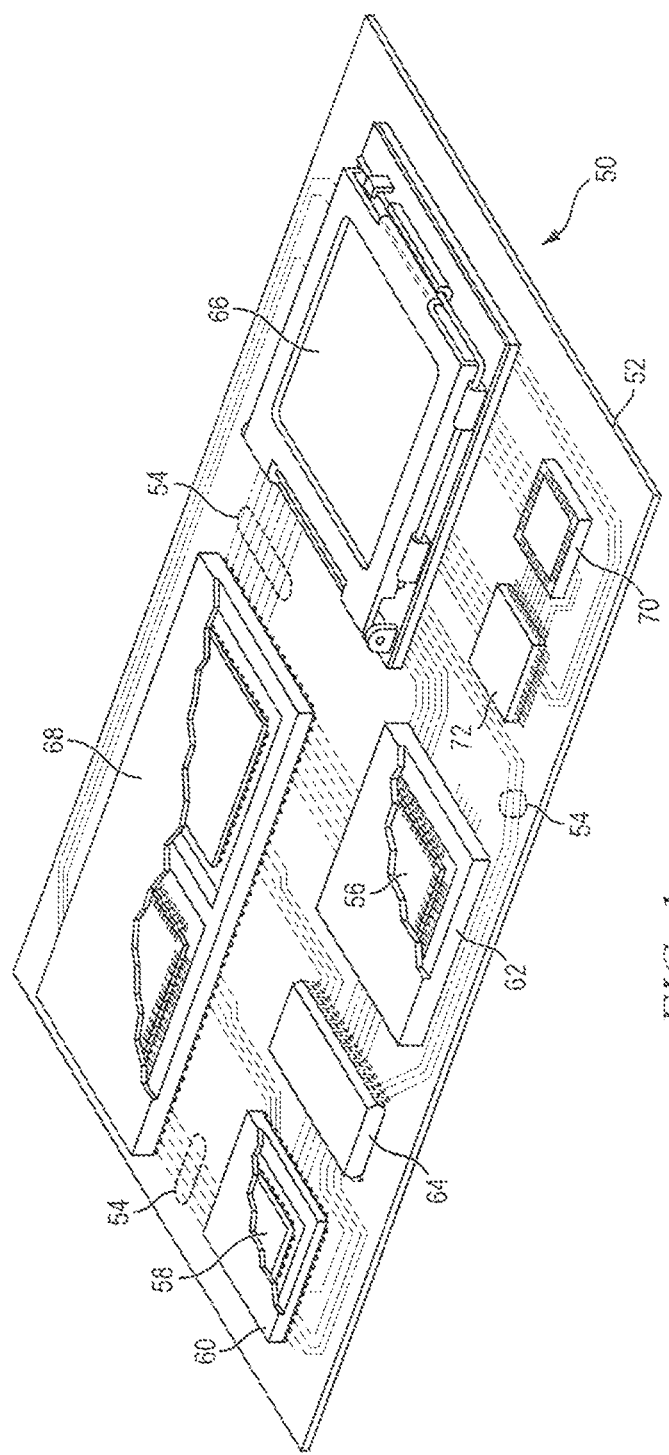
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of the semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
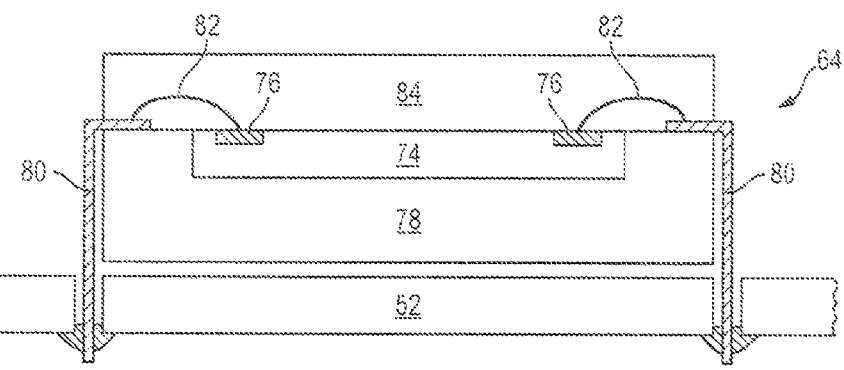
FIGS. 2a-2c illustrate further detail of the representative semiconductor packages mounted to the PCB.
Figure 2B:
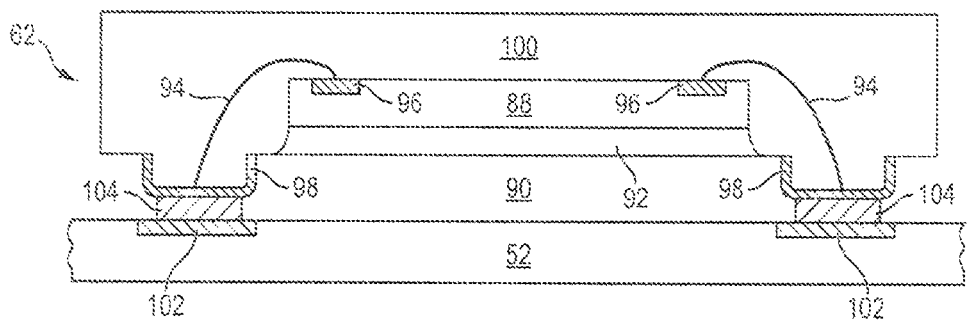
Figure 2C:
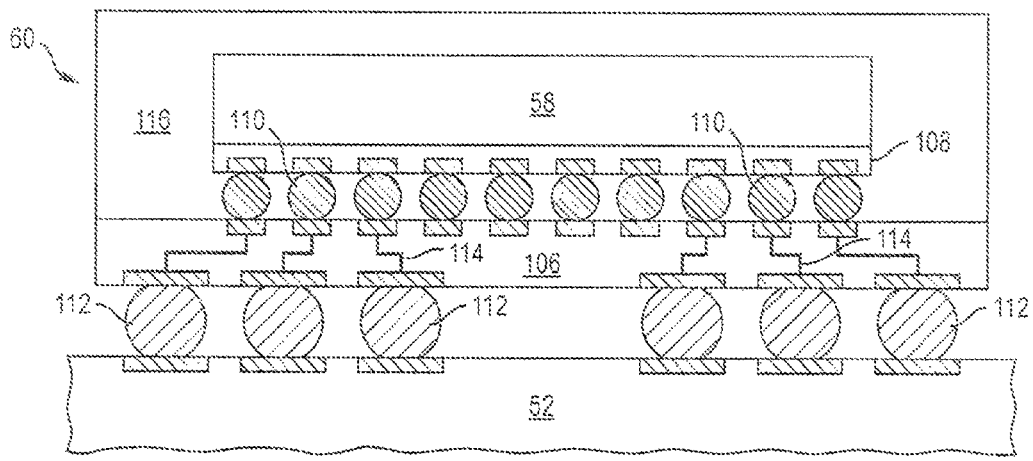

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

Figure 4A:
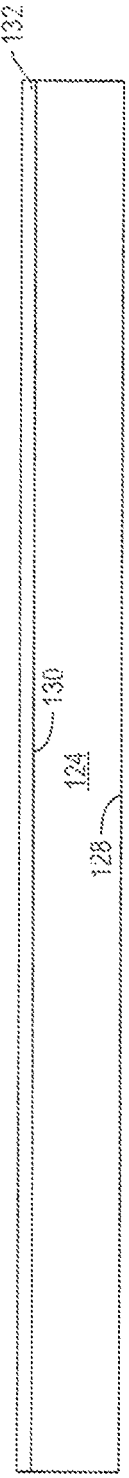

FIGS. 4a-4j illustrate, in relation to FIGS. 1 and 2a-2c, a process of forming micro-vias partially through an insulating material over a bump interconnect conductive layer for stress relief. FIG. 4a shows a portion of one semiconductor die 124 of semiconductor wafer 120. An insulating or passivation layer 132 is formed over active surface 130 of semiconductor die 124 using PVD, CVD, printing, spin coating, spray coating, sintering or thermal oxidation. The insulating layer 132 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), hafnium oxide ($HfO_2$), benzocyclobutene (BCB), polyimide (PI), polybenzoxazoles (PBO), or other suitable insulating material.

Figure 4B:
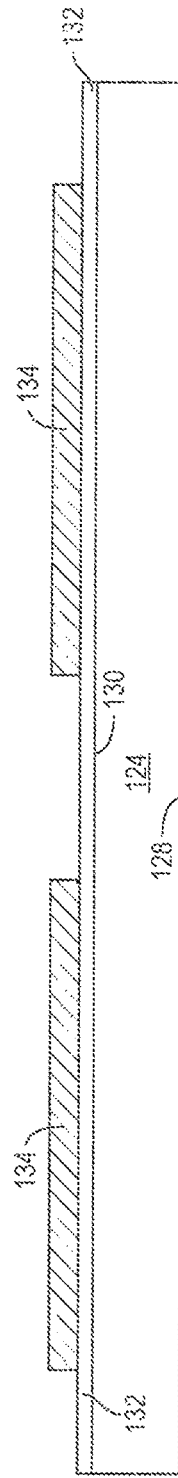

In FIG. 4b, an electrically conductive layer 134 is formed over insulating layer 132 using PVD, CVD, electrolytic plating, electroless plating process, or other suitable metal deposition process. Conductive layer 134 can be one or more layers of Al, Cu, Sn, Ni, Au, Ag, or other suitable electrically conductive material. Conductive layer 134 operates as contact pads electrically connected to the circuits on active surface 130. Contact pads 134 can be disposed side-by-side a first distance from the edge of semiconductor die 124, as shown in FIG. 4b. Alternatively, contact pads 134 can be offset in multiple rows such that a first row of contact pads is disposed a first distance from the edge of the die, and a second row of contact pads alternating with the first row is disposed a second distance from the edge of the die.

Figure 4C:
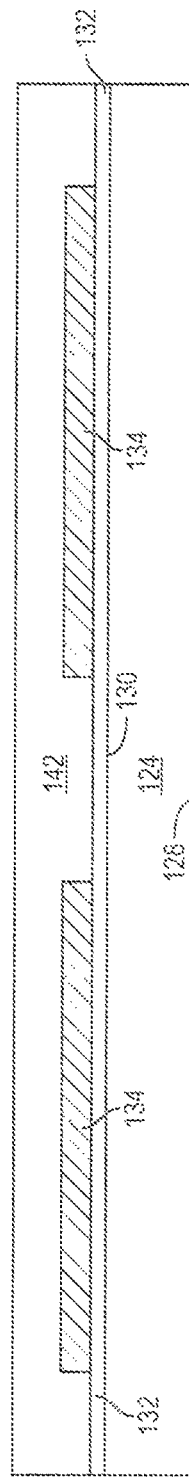

In FIG. 4c, an insulating or passivation layer 142 is formed over insulating layer 132 and conductive layer 134 using PVD, CVD, printing, spin coating, spray coating, sintering or thermal oxidation. The insulating layer 142 contains one or more layers of $SiO_2$, $Si_3N_4$, SiON, $Ta_2O_5$, $Al_2O_3$, $HfO_2$, BCB, PI, PBO, or other suitable insulating material. The insulating layer 142 has a thickness of 3-70 micrometers (μm).

In FIG. 4d, a portion of insulating layer 142 is removed by an etching process through a patterned photoresist layer to expose conductive layer 134. Alternatively, a portion of insulating layer 142 is removed by laser direct ablation (LDA) using laser 143. The etching or LDA process also forms a plurality of micro-vias or micro-openings 144 extending partially through insulating layer 142 over conductive layer 134. Micro-vias 144 are smaller than the photoresist resolution capability to achieve partially developed patterns without exposing conductive layer 134.

Figure 4F:
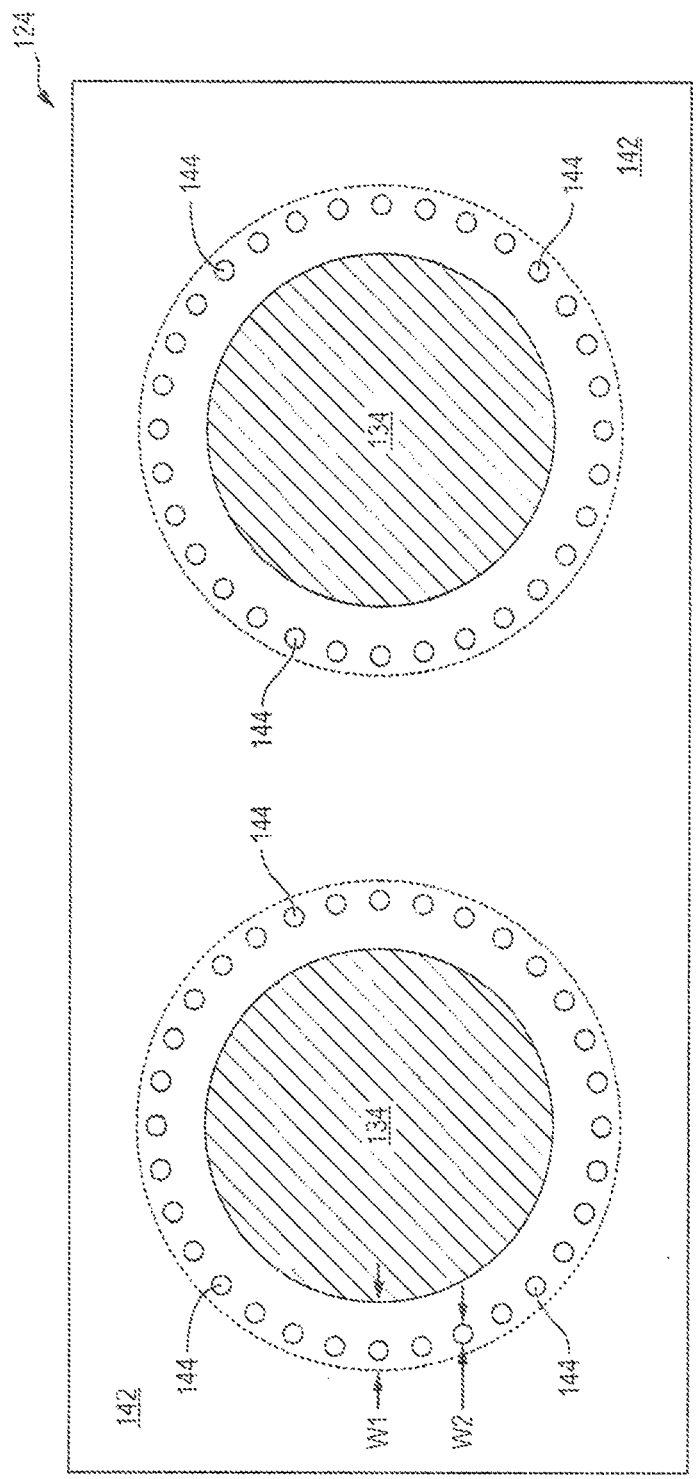

FIG. 4e shows a plan view of semiconductor die 124 with conductive layer 134 and micro-vias 144 formed partially through insulating layer 142 over conductive layer 134. In one embodiment, 16 micro-vias 144 are formed partially through insulating layer 142 over conductive layer 134. An overlap between insulating layer 142 and conductive layer 134 has a width W1 of 20-50 μm. Micro-vias 144 have a width W2 of 0.5-10 μm and depth less than a thickness of insulating layer 142 to avoid exposing conductive layer 134. FIG. 4f shows a plan view of semiconductor die 124 with up to 32 micro-vias 144 are formed partially through insulating layer 142 over conductive layer 134.

In another embodiment, FIG. 4g shows a plan view of semiconductor die 124 with conductive layer 134 and micro-via ring 146 formed partially through insulating layer 142 over conductive layer 134. An overlap between insulating layer 142 and conductive layer 134 has a width W3 of 20-50 μm, and micro-via ring 146 have a width W4 of 0.5-10 μm and depth less than a thickness of insulating layer 142 to avoid exposing conductive layer 134.

Figure 4H:
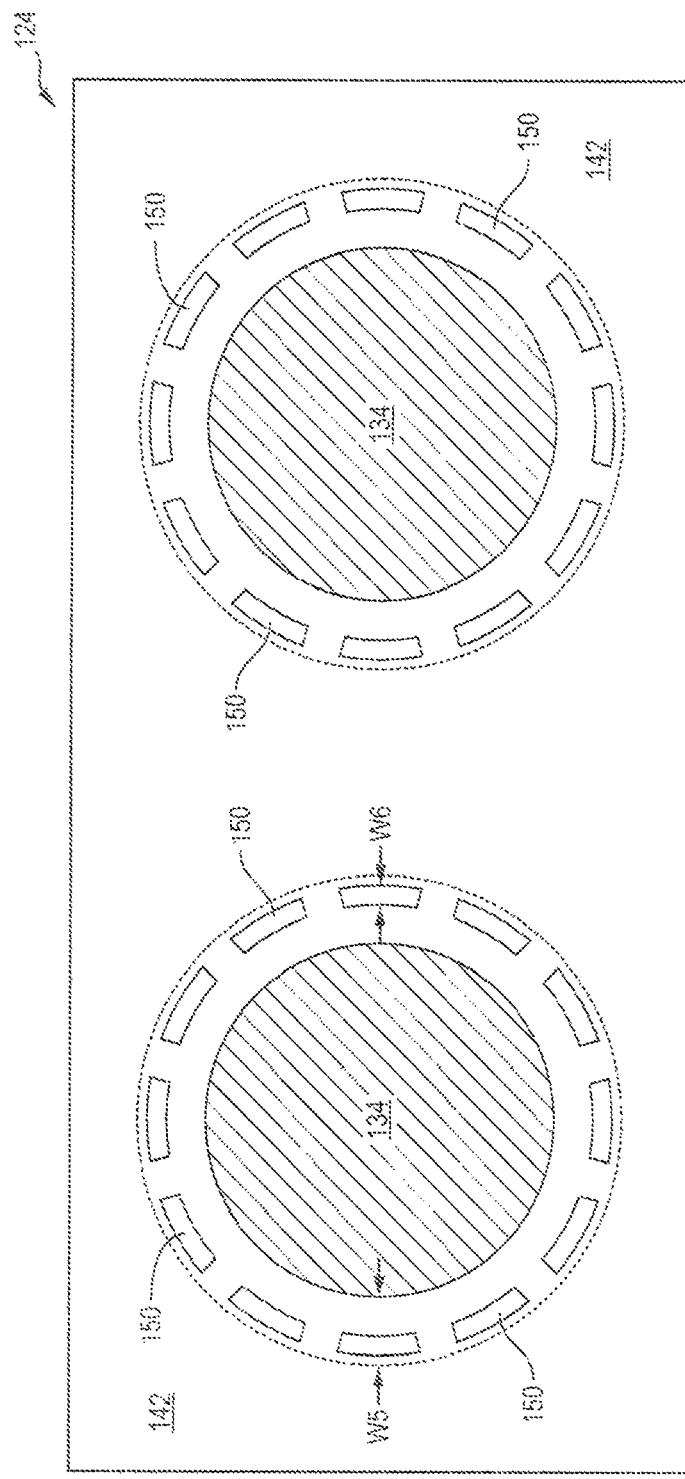

FIG. 4h shows a plan view of semiconductor die 124 with conductive layer 134 and micro-via slots 150 formed partially through insulating layer 142 over conductive layer 134. An overlap between insulating layer 142 and conductive layer 134 has a width W5 of 20-50 μm, and micro-via slots 150 have a width W6 of 0.5-10 μm and depth less than a thickness of insulating layer 142 to avoid exposing conductive layer 134.

In FIG. 4i, an electrically conductive bump material is deposited over conductive layer 134 and insulating layer 142 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 134 using a suitable attachment or bonding process. In one embodiment, the bump material is reflowed by heating the material above its melting point to form balls or bumps 154. In some applications, bumps 154 are reflowed a second time to improve electrical contact to conductive layer 134. Bumps 154 can also be compression bonded to conductive layer 134. Bumps 154 represent one type of interconnect structure that can be formed over conductive layer 134. The interconnect structure can also use stud bump, micro bump, or other electrical interconnect.

In FIG. 4j, an insulating layer 156 is formed over and within micro-vias 144 and over bumps 154 for additional structural support of the bumps. In one embodiment, insulating layer 156 is a flux residue polymer. Bumps 154 are electrically connected to conductive layer 134 formed on active surface 130 of semiconductor die 124. The insulating layer 142 formed in micro-vias 144 provide stress relief for bumps 154 by redistributing the stress profile to reduce cracking and other interconnect defects. Similarly, the insulating layer 142 in micro-via ring 146 or micro-via slots 150 in FIGS. 4h-4i provide stress relief for bumps 154 by redistributing the stress profile to reduce cracking of insulating layer 142 over conductive layer 134 and other interconnect defects.

Figure 5A:
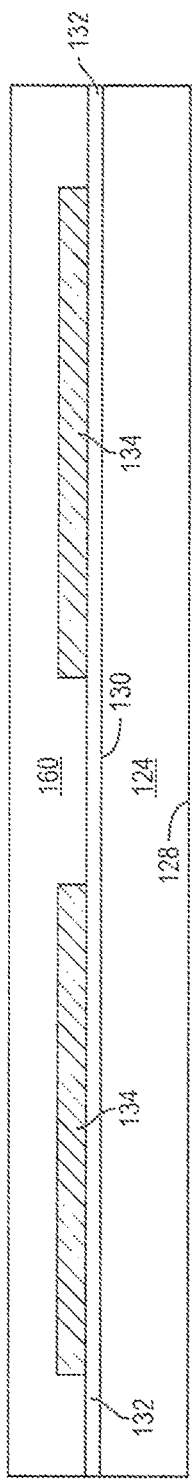

FIGS. 5a-5e show another embodiment of forming micro-vias partially through an insulating material over a bump interconnect conductive layer with an island of insulating material disposed over a central portion of the bump interconnect structure for stress relief. Continuing from FIG. 4b, an insulating or passivation layer 160 is formed over insulating layer 132 and conductive layer 134 using PVD, CVD, printing, spin coating, spray coating, sintering or thermal oxidation, as shown in FIG. 5a. The insulating layer 160 contains one or more layers of SiO2, Si3N4, SiON, Ta2O5, Al2O3, HfO2, BCB, PI, PBO, or other suitable insulating material. The insulating layer 160 has a thickness of 3-70 μm.

Figure 5B:
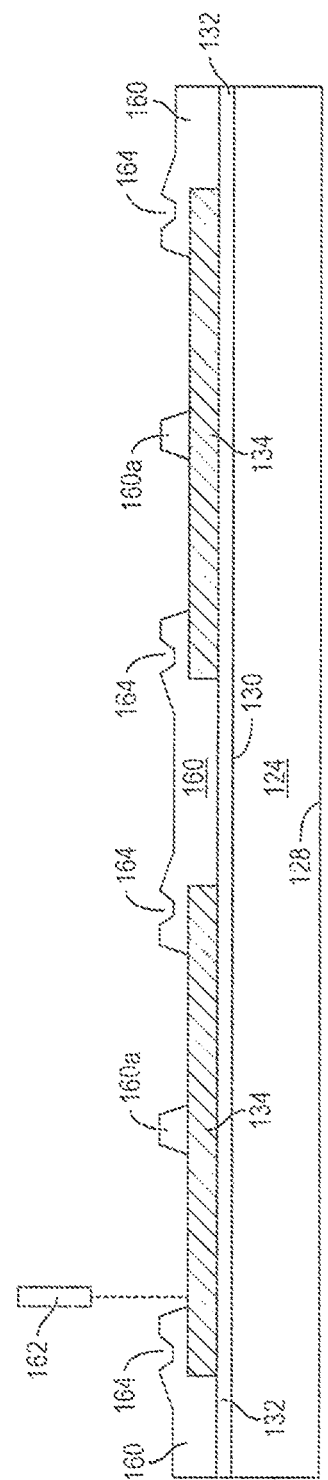

In FIG. 5b, a portion of insulating layer 160 is removed by an etching process through a patterned photoresist layer to expose conductive layer 134. Alternatively, a portion of insulating layer 160 is removed by LDA using laser 162. In particular, the etching or LDA process leaves an island 160a of insulating layer 160 disposed over a central area of conductive layer 134. The etching or LDA process also forms a plurality of micro-vias or micro-openings 164 extending partially through insulating layer 160 over conductive layer 134. Micro-vias 164 are smaller than the photoresist resolution capability to achieve partially developed patterns without exposing conductive layer 134.

Figure 5C:
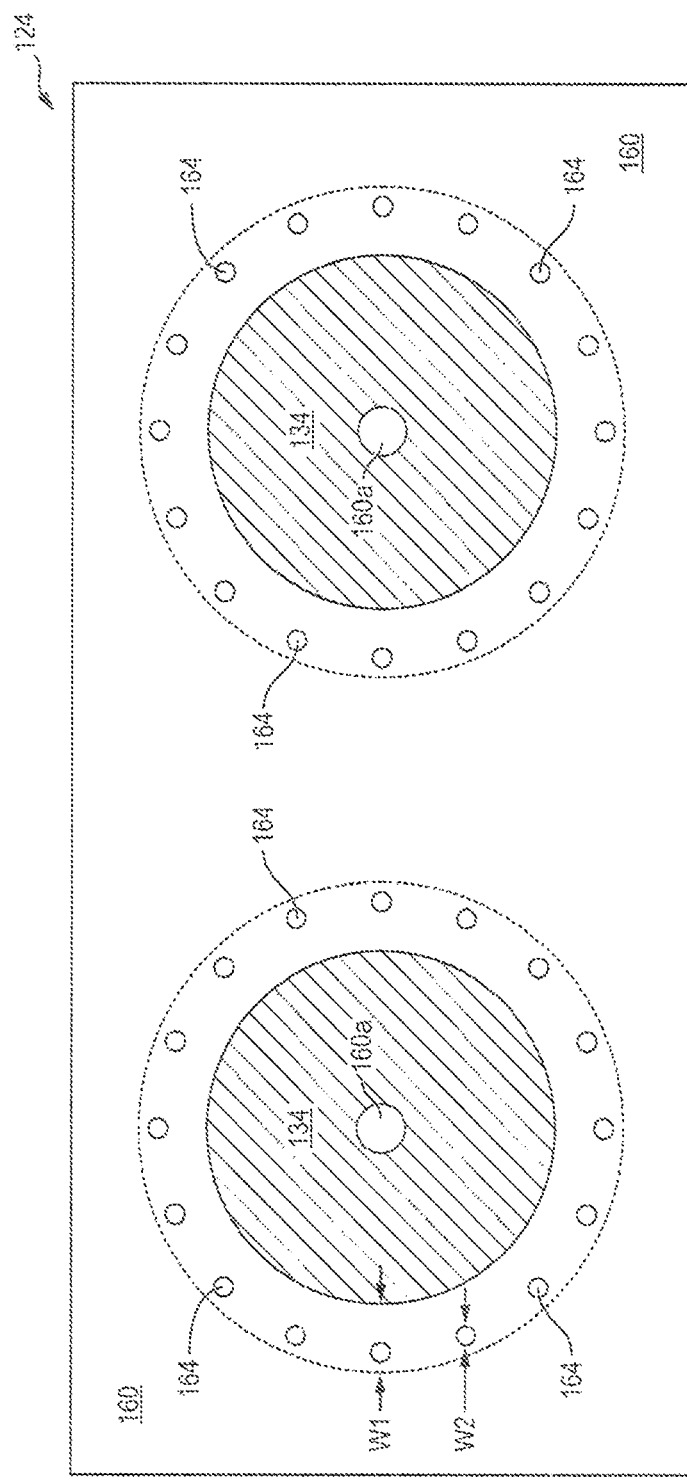

FIG. 5c shows a plan view of semiconductor die 124 with conductive layer 134 and micro-vias 164 formed partially through insulating layer 160 over conductive layer 134. In one embodiment, 16 micro-vias 164 are formed partially through insulating layer 160 over conductive layer 134. An overlap between insulating layer 160 and conductive layer 134 has a width W1 of 20-50 μm. Micro-vias 164 have a width W2 of 0.5-10 μm and depth less than a thickness of insulating layer 160 to avoid exposing conductive layer 134. Additional micro-vias 164 can be formed partially through insulating layer 160 over conductive layer 134, similar to FIG. 4f. A micro-via ring or micro-via slots can be formed partially through insulating layer 160 over conductive layer 134, similar to FIGS. 4g-4h.

In FIG. 5d, an electrically conductive bump material is deposited over conductive layer 134 and insulating layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 134 using a suitable attachment or bonding process. In one embodiment, the bump material is reflowed by heating the material above its melting point to form balls or bumps 166. In some applications, bumps 166 are reflowed a second time to improve electrical contact to conductive layer 134. Bumps 166 can also be compression bonded to conductive layer 134. Bumps 166 represent one type of interconnect structure that can be formed over conductive layer 134. The interconnect structure can also use stud bump, micro bump, or other electrical interconnect.

In FIG. 5e, an insulating layer 168 is formed over and within micro-vias 164 and over bumps 166 for additional structural support of the bumps. In one embodiment, insulating layer 168 is a flux residue polymer. Bumps 166 are electrically connected to conductive layer 134 formed on active surface 130 of semiconductor die 124. The insulating layer 160 formed in micro-vias 164, as well as island 160a of insulating layer 160 disposed over a central area of conductive layer 134, provide stress relief for bumps 166 by redistributing the stress profile to reduce cracking and other interconnect defects.

Figure 6C:
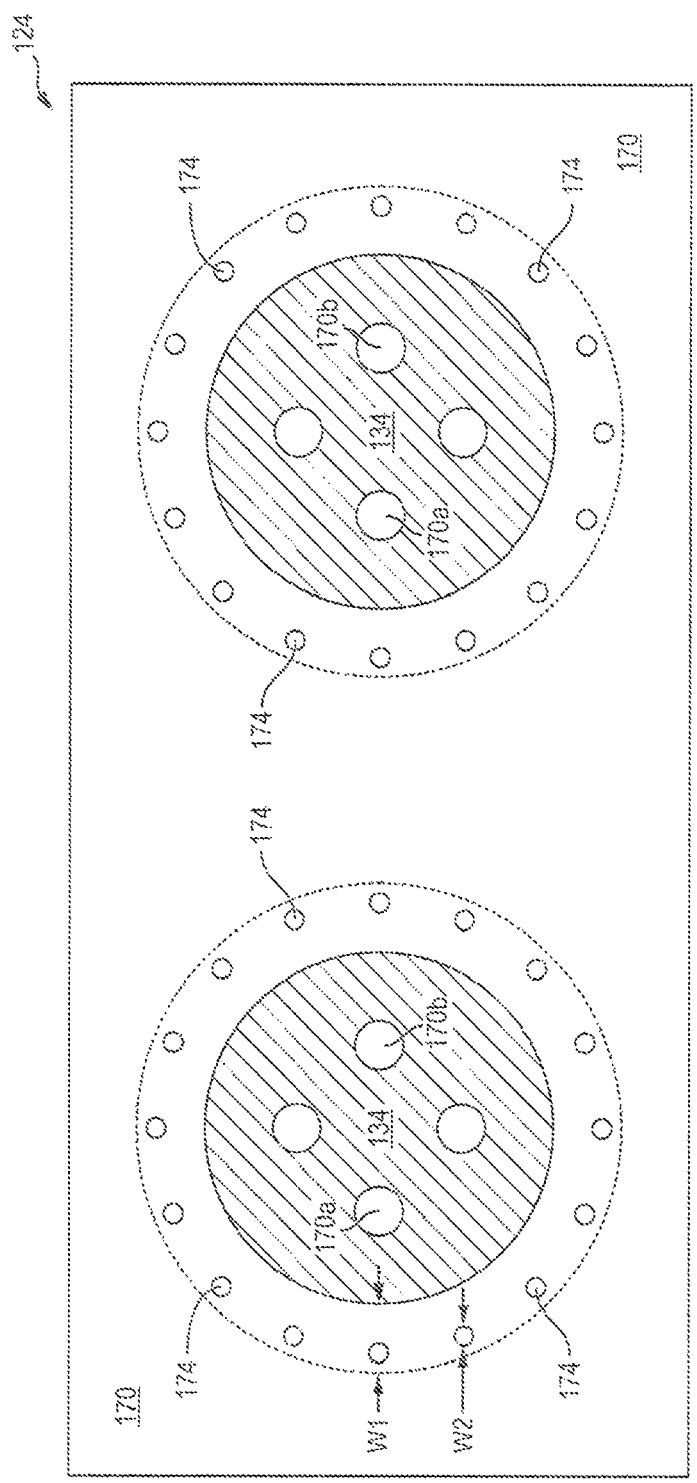

FIGS. 6a-6e show another embodiment of forming micro-vias partially through an insulating material over a bump interconnect conductive layer with a plurality of islands of insulating material disposed over the bump interconnect structure for stress relief. Continuing from FIG. 4b, an insulating or passivation layer 170 is formed over insulating layer 132 and conductive layer 134 using PVD, CVD, printing, spin coating, spray coating, sintering or thermal oxidation, as shown in FIG. 6a. The insulating layer 170 contains one or more layers of SiO2, Si3N4, SiON, Ta2O5, Al2O3, HfO2, BCB, PI, PBO, or other suitable insulating material. The insulating layer 170 has a thickness of 3-70 μm.

In FIG. 6b, a portion of insulating layer 170 is removed by an etching process through a patterned photoresist layer to expose conductive layer 134. Alternatively, a portion of insulating layer 170 is removed by LDA using laser 172. In particular, the etching or LDA process leaves a plurality of islands 170a-170b of insulating layer 170 disposed over conductive layer 134. The etching or LDA process also forms a plurality of micro-vias or micro-openings 174 extending partially through insulating layer 170 over conductive layer 134. Micro-vias 174 are smaller than the photoresist resolution capability to achieve partially developed patterns without exposing conductive layer 134.

FIG. 6c shows a plan view of semiconductor die 124 with conductive layer 134 and micro-vias 174 formed partially through insulating layer 170 over conductive layer 134. In one embodiment, 16 micro-vias 174 are formed partially through insulating layer 170 over conductive layer 134. An overlap between insulating layer 170 and conductive layer 134 has a width W1 of 20-50 μm. Micro-vias 174 have a width W2 of 0.5-10 μm and depth less than a thickness of insulating layer 170 to avoid exposing conductive layer 134. Additional micro-vias 174 can be formed partially through insulating layer 170 over conductive layer 134, similar to FIG. 4f. A micro-via ring or micro-via slots can be formed partially through insulating layer 170 over conductive layer 134, similar to FIGS. 4g-4h.

In FIG. 6d, an electrically conductive bump material is deposited over conductive layer 134 and insulating layer 170 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 134 using a suitable attachment or bonding process. In one embodiment, the bump material is reflowed by heating the material above its melting point to form balls or bumps 176. In some applications, bumps 176 are reflowed a second time to improve electrical contact to conductive layer 134. Bumps 176 can also be compression bonded to conductive layer 134. Bumps 176 represent one type of interconnect structure that can be formed over conductive layer 134. The interconnect structure can also use stud bump, micro bump, or other electrical interconnect.

In FIG. 6e, an insulating layer 178 is formed over and within micro-vias 174 and over bumps 176 for additional structural support of the bumps. In one embodiment, insulating layer 178 is a flux residue polymer. Bumps 176 are electrically connected to conductive layer 134 formed on active surface 130 of semiconductor die 124. The insulating layer 170 formed in micro-vias 174, as well as islands 170a-170b of insulating layer 170 disposed over conductive layer 134, provide stress relief for bumps 176 by redistributing the stress profile to reduce cracking and other interconnect defects.

FIGS. 7a-7g show another embodiment of forming micro-vias partially through a first insulating material with the bump interconnect conductive layer extending into a second insulating layer for stress relief. Continuing from FIG. 4a, an insulating or passivation layer 180 is formed over active surface 130 of semiconductor die 124 using PVD, CVD, printing, spin coating, spray coating, sintering or thermal oxidation, as shown in FIG. 7a. The insulating layer 180 contains one or more layers of SiO2, Si3N4, SiON, Ta2O5, Al2O3, HfO2, BCB, PI, PBO, or other suitable insulating material. The insulating layer 180 has a thickness of 3-70 μm. A portion of insulating layer 180 is removed by an etching process to form micro-vias or micro-openings 182 in the insulating layer. Micro-vias 182 are smaller than the photoresist resolution capability to achieve partially developed patterns without exposing active surface 130. In one embodiment, micro-vias 182 are formed in a staggered layout with 5 μm width and 10 μm pitch. Alternatively, a portion of insulating layer 180 is removed by LDA using laser 184 to form micro-vias or micro-openings 182 in the insulating layer.

In FIG. 7b, an electrically conductive layer 186 is formed over insulating layer 180 and into micro-vias 182 using PVD, CVD, electrolytic plating, electroless plating process, or other suitable metal deposition process. Conductive layer 186 can be one or more layers of Al, Cu, Sn, Ni, Au, Ag, or other suitable electrically conductive material. Conductive layer 186 operates as contact pads electrically connected to the circuits on active surface 130. Contact pads 186 can be disposed side-by-side a first distance from the edge of semiconductor die 124. Alternatively, contact pads 186 can be offset in multiple rows such that a first row of contact pads is disposed a first distance from the edge of the die, and a second row of contact pads alternating with the first row is disposed a second distance from the edge of the die.

In FIG. 7c, an insulating or passivation layer 188 is formed over insulating layer 180 and conductive layer 186 using PVD, CVD, printing, spin coating, spray coating, sintering or thermal oxidation. The insulating layer 188 contains one or more layers of SiO2, Si3N4, SiON, Ta2O5, Al2O3, HfO2, BCB, PI, PBO, or other suitable insulating material. The insulating layer 188 has a thickness of 3-70 μm.

In FIG. 7d, a portion of insulating layer 188 is removed by an etching process through a patterned photoresist layer to expose conductive layer 186. Micro-vias 192 are smaller than the photoresist resolution capability to achieve partially developed patterns without exposing conductive layer 186. Alternatively, a portion of insulating layer 188 is removed by LDA using laser 190. The etching or LDA process also forms a plurality of micro-vias or micro-openings 192 extending partially through insulating layer 188 over conductive layer 186.

FIG. 7e shows a plan view of semiconductor die 124 with conductive layer 134 and micro-vias 192 formed partially through insulating layer 188 over conductive layer 186. In one embodiment, 16 micro-vias 192 are formed partially through insulating layer 188 over conductive layer 186. An overlap between insulating layer 188 and conductive layer 186 has a width W1 of 20-50 μm. Micro-vias 192 have a diameter or width W2 of 0.5-10 μm and depth less than a thickness of insulating layer 188 to avoid exposing conductive layer 186. Additional micro-vias 192, e.g., up to 32 micro-vias, can be formed partially through insulating layer 188 over conductive layer 186, similar to FIG. 4f. A micro-via ring or micro-via slots can be formed partially through insulating layer 188 over conductive layer 186, similar to FIGS. 4g-4h.

In FIG. 7f, an electrically conductive bump material is deposited over conductive layer 186 and insulating layer 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 186 using a suitable attachment or bonding process. In one embodiment, the bump material is reflowed by heating the material above its melting point to form balls or bumps 196. In some applications, bumps 196 are reflowed a second time to improve electrical contact to conductive layer 186. Bumps 196 can also be compression bonded to conductive layer 186. Bumps 196 represent one type of interconnect structure that can be formed over conductive layer 186. The interconnect structure can also use stud bump, micro bump, or other electrical interconnect.

In FIG. 7g, an insulating layer 198 is formed over and within micro-vias 192 and over bumps 196 for additional structural support of the bumps. In one embodiment, insulating layer 198 is a flux residue polymer. Bumps 196 are electrically connected to conductive layer 186 formed on active surface 130 of semiconductor die 124. Micro-vias 182 increase the thickness of conductive layer 186 under bumps 196 for higher reliability. The insulating layer 188 formed in micro-vias 192 provides stress relief for bumps 196 by redistributing the stress profile to reduce cracking and other interconnect defects.

Figure 8:
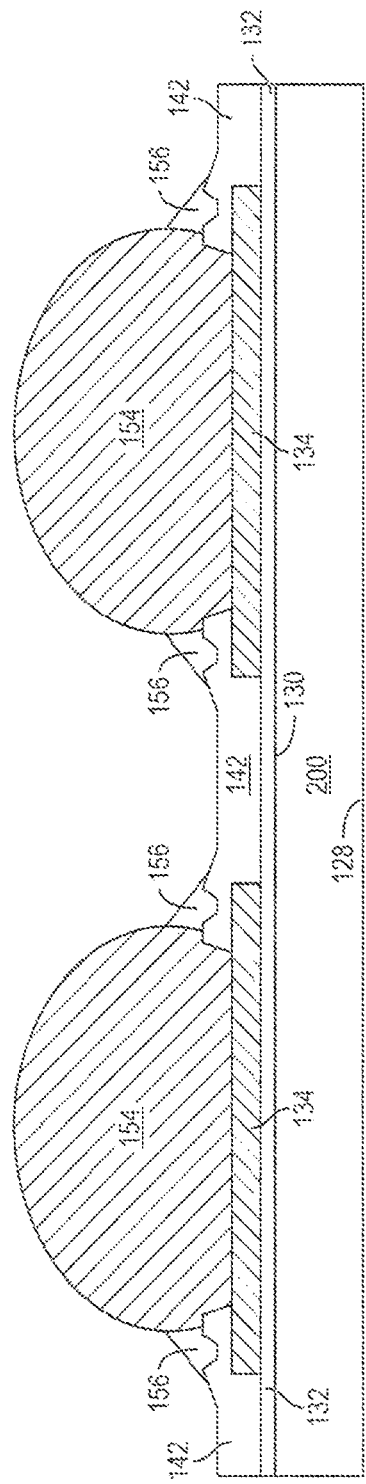
FIG. 8 illustrates a non-active substrate with micro-vias formed partially through an insulating material over a bump interconnect conductive layer for stress relief.

FIG. 8 illustrates an embodiment, similar to FIGS. 4a-4i, with conductive layer 134, insulating layer 142, and bumps 154 formed over a non-active substrate 200, such as a PCB. Conductive layer 134 is electrically connected to conductive traces within substrate 200 for electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   forming a first insulating layer over the semiconductor die;
   forming a conductive layer over the first insulating layer;
   forming a second insulating layer over the first insulating layer and conductive layer;
   removing a portion of the second insulating layer to expose the conductive layer and form a plurality of first micro-vias partially through the second insulating layer over the conductive layer; and
   forming a bump over the conductive layer, wherein the first micro-vias provide stress relief.

2. The method of claim 1, wherein removing the portion of the second insulating layer leaves an island of the second insulating layer over the conductive layer.

3. The method of claim 1, further including forming a third insulating layer in the first micro-vias over the bump.

4. The method of claim 1, further including:
   forming a plurality of second micro-vias in the first insulating layer; and
   forming the conductive layer over the second micro-vias.

5. The method of claim 1, wherein a number of the first micro-vias in the second insulating layer ranges from 16 to 32.

6. A method of making a semiconductor device, comprising:
   providing a substrate;
   forming a conductive layer over the substrate;
   forming a first insulating layer over the substrate and conductive layer;
   removing a portion of the first insulating layer to expose a portion of the conductive layer and form a plurality of first micro-openings partially through the first insulation layer around the exposed portion of the conductive layer; and
   forming an interconnect structure over the conductive layer.

7. The method of claim 6, further including forming a second insulating layer over the substrate prior to forming the conductive layer.

8. The method of claim 7, further including:
   forming a plurality of second micro-openings in the second insulating layer; and
   forming the conductive layer over the second micro-openings.

9. The method of claim 6, wherein removing the portion of the first insulating layer leaves an island of the first insulating layer over the conductive layer.

10. The method of claim 6, further including forming a second insulating layer in the first micro-openings over the interconnect structure.

11. The method of claim 6, wherein the first micro-openings include micro-vias, micro-via rings, or micro-via slots.

12. The method of claim 6, wherein a width of the first micro-openings in the first insulating layer ranges from 0.5 to 10 micrometers.

13. The method of claim 6, wherein the interconnect structure includes a bump.

14. A method of making a semiconductor device, comprising:
   providing a substrate;
   forming a conductive layer over the substrate;
   forming a first insulating layer including a plurality of first micro-openings partially through the first insulating layer and over the conductive layer; and
   forming an interconnect structure over the conductive layer.

15. The method of claim 14, further including forming a second insulating layer over the substrate.

16. The method of claim 15, further including:
   forming a plurality of second micro-openings in the second insulating layer; and
   forming the conductive layer over the second micro-openings.

17. The method of claim 14, further including forming an island of the first insulating layer over the conductive layer.

18. The method of claim 14, further including forming a second insulating layer in the first micro-openings over the interconnect structure.

19. The method of claim 14, wherein the first micro-openings include micro-vias, micro-via rings, or micro-via slots.

20. The method of claim 14, wherein the interconnect structure includes a bump.

21. A method of making a semiconductor device, comprising:
   providing a substrate;
   forming a conductive layer over the substrate; and
   forming a first insulating layer over the substrate and conductive layer and including a plurality of first micro-openings partially through the first insulating layer.

22. The method of claim 21, further including forming a second insulating layer over the substrate.

23. The method of claim 22, further including:
   forming a plurality of second micro-openings in the second insulating layer; and
   forming the conductive layer over the second micro-openings.

24. The method of claim 21, wherein the first micro-openings include micro-vias, micro-via rings, or micro-via slots.

25. The method of claim 21, further including forming a bump over the conductive layer.

* * * * *